United States Patent
Ota

(10) Patent No.: US 7,257,755 B2
(45) Date of Patent: Aug. 14, 2007

(54) DRIVER IC AND INSPECTION METHOD FOR DRIVER IC AND OUTPUT DEVICE

(75) Inventor: Yusuke Ota, Nagano-ken (JP)

(73) Assignee: Seiko Epson Corporation (JP)

( * ) Notice: Subject to any disclaimer, the term of this patent is extended or adjusted under 35 U.S.C. 154(b) by 232 days.

(21) Appl. No.: 11/020,001

(22) Filed: Dec. 21, 2004

(65) Prior Publication Data

US 2005/0140401 A1  Jun. 30, 2005

(30) Foreign Application Priority Data

Dec. 25, 2003  (JP) .............................. 2003-429405

(51) Int. Cl.
*G01R 31/28* (2006.01)
(52) U.S. Cl. ...................... 714/738; 714/719
(58) Field of Classification Search ...................... None
See application file for complete search history.

(56) References Cited

U.S. PATENT DOCUMENTS

2002/0158832 A1* 10/2002 Park et al. ..................... 345/98
2003/0028836 A1*  2/2003 Maeda et al. ................ 714/724
2005/0035805 A1*  2/2005 Tanada ......................... 327/291

FOREIGN PATENT DOCUMENTS

| JP | 06-186279 | 7/1994 |
|---|---|---|
| JP | 10/213616 | 8/1998 |
| JP | 2000-055988 | 2/2000 |

\* cited by examiner

*Primary Examiner*—Guy Lamarre
*Assistant Examiner*—Merant Guerrier
(74) *Attorney, Agent, or Firm*—Harness, Dickey & Pierce, P.L.C.

(57) ABSTRACT

A driver IC including: a plurality of output pads; and a plurality of signal switch circuits, each of the signal circuits being provided on one of signal paths respectively connected to the output pads, wherein each of the signal switch circuits switches between a first state (or a use state) in which a signal from an upstream side of the signal path is allowed to pass through the signal switch circuit and a second state (or an inspection state) in which a level pattern of signals from the output pads is fixed to an inspection level pattern, according to a control signal.

10 Claims, 13 Drawing Sheets

| A | B | OUTPUT | STATE |
|---|---|--------|-------|
| 0 | 0 | H | SECOND STATE |
| 1 | 0 | H | NOT USED |
| 0 | 1 | L | SECOND STATE |
| 1 | 1 | THROUGH | FIRST STATE |

| CONTROL SIGNAL | A-1 | A-2 | B-1 | B-2 |
|---|---|---|---|---|
| LEVEL | 0 | 0 | 1 | 0 |

⇩

OUTPUT STATE

| GAIN SIGNAL | A-1 | A-2 | B-1 | B-2 |
|---|---|---|---|---|
| LEVEL | 0 | 0 | 0 | 1 |

⇩

OUTPUT STATE

| CONTROL SIGNAL | A-1 | A-2 | A-3 | A-4 | B-1 | B-2 | B-3 | B-4 |
|---|---|---|---|---|---|---|---|---|
| LEVEL | 0 | 0 | 0 | 0 | 1 | 1 | 0 | 0 |

OUTPUT STATE

| 1-1 | 1-2 | 1-3 | 1-4 |
|---|---|---|---|
| L | L | L | L |

| 2-1 | 2-2 | 2-3 | 2-4 |
|---|---|---|---|
| H | H | H | H |

| GAIN SIGNAL | A-1 | A-2 | A-3 | A-4 | B-1 | B-2 | B-3 | B-4 |
|---|---|---|---|---|---|---|---|---|
| LEVEL | 0 | 0 | 0 | 0 | 1 | 0 | 0 | 1 |

OUTPUT STATE

| 1-1 | 1-2 | 1-3 | 1-4 |
|---|---|---|---|
| L | H | L | H |

| 2-1 | 2-2 | 2-3 | 2-4 |
|---|---|---|---|
| H | L | H | L |

FIG. 20

| A | B | C | V0 | V1 | V2 | V3 | V4 |
|---|---|---|----|----|----|----|----|
| 1 | 0 | 0 | 0 | THROUGH | | | |
| 0 | 0 | 1 | H | L | L | L | L |
| 0 | 1 | 0 | L | L | L | L | H |

DRIVER IC AND INSPECTION METHOD FOR DRIVER IC AND OUTPUT DEVICE

Japanese Patent Application No. 2003-429405, filed on Dec. 25, 2003, is hereby incorporated by reference in its entirety.

BACKGROUND OF THE INVENTION

The present invention relates to a driver IC having an inspection function, and an inspection method for the driver IC. The present invention also relates to an inspection method for an output device driven by a driver IC having an inspection function, such as a display device including a liquid crystal, organic EL, or LED, or a printer.

A driver IC includes a number of output pads (banks) at least along the direction of the long side of an IC chip. The driver IC is subjected to various types of inspection in a state formed on a semiconductor wafer or in a completed state after packaging. The inspection is performed by supplying an inspection signal to the driver IC after supplying an inspection command, and monitoring the output from the driver IC.

As an example of this type of inspection, a pad-to-pad leakage test can be given. In the case of a display driver IC including a display RAM, the presence or absence of leakage is determined by writing inspection data into the RAM so that signals at different signal levels are output from adjacent output pads, and measuring the entire current which flows from a power supply in the driver IC when causing the display driver IC to drive a display.

Therefore, programming of write pattern setting, display duty setting (screen partial display), and display ON setting into the RAM is necessary when inspecting the driver IC including a RAM so that such outputs are output from the output pads.

The output pad arrangement of the driver IC is not limited to the arrangement in which the output pads are arranged in one line along the long side of the driver IC as described later in detail. Therefore, since the pad-to-pad leakage test must be manually performed corresponding to the type of driver IC taking the output pad arrangement into consideration, the operation is complicated and a considerable amount of time is required for programming. In this operation, a pattern signal must be supplied from the outside not only to a driver IC including a RAM, but also to a driver IC which does not include a RAM.

The above-described problem is not limited to the pad-to-pad leakage test. For example, when inspecting an output device driven by a driver IC, such as a display device including a liquid crystal panel, organic EL panel, or LED, or a printer, it is necessary to inspect the output device by supplying various pattern signals to the driver IC.

Japanese Patent Application Laid-open No. 6-186279 was found as a conventional technology as a result of search for the pad-to-pad leakage test. However, Japanese Patent Application Laid-open No. 6-186279 does not provide the IC with an inspection function and is irrelevant to the subject matter of the present invention.

BRIEF SUMMARY OF THE INVENTION

According to a first aspect of the present invention, there is provided a driver IC comprising:

a plurality of output pads; and a plurality of signal switch circuits, each of the signal circuits being provided on one of signal paths respectively connected to the output pads, wherein each of the signal switch circuits switches between a first state in which a signal from an upstream side of the signal path is allowed to pass through the signal switch circuit and a second state in which a level pattern of signals from the output pads is fixed to an inspection level pattern, according to a control signal.

According to a second aspect of the present invention, there is provided a method of inspecting the above-described driver IC, wherein the driver IC is inspected by:

setting the driver IC to the first state;

supplying signals having the inspection level pattern through the signal paths to the output pads; and causing the signals to be output from the output pads.

According to a third aspect of the present invention, there is provided a method of inspecting the above-described driver IC, wherein pad-to-pad leakage is inspected by:

setting the driver IC to the first state;

supplying signals having the inspection level pattern through the signal paths to the output pads; and causing the signals to be output from the output pads.

According to a fourth aspect of the present invention, there is provided a method of inspecting an output device, wherein the output device is inspected by:

setting the above-described driver IC to the first state;

connecting the output device driven by the driver IC to the driver IC;

supplying signals having the inspection level pattern through the signal paths of the driver IC to the output pads; and causing the signals to be output from the output pads.

BRIEF DESCRIPTION OF THE SEVERAL VIEWS OF THE DRAWING

FIG. 20 is a table showing an operation state of the signal switch circuit shown in FIG. 19.

DETAILED DESCRIPTION OF THE EMBODIMENTS

Figure 1:
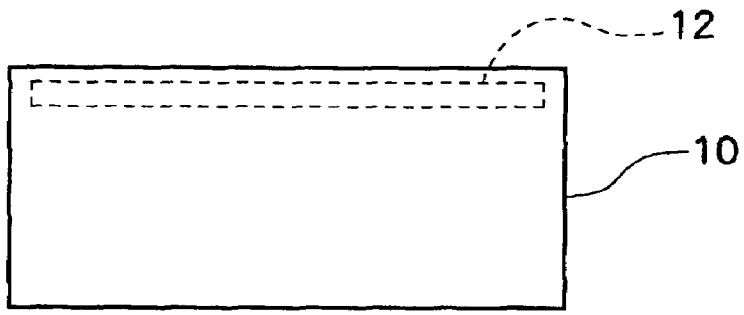
FIG. 1 is a plan view showing an output pad region of a driver IC.

The following embodiments of the present invention have been achieved in view of the above-described problems, and may provide a driver IC which has a function of supplying inspection signals inside the IC without receiving various inspection signals from outside, and an inspection method for the driver IC.

The embodiments may also provide an inspection method for an output device driven by a driver IC by using an inspection function of the driver IC.

According to one embodiment of the present invention, there is provided a driver IC comprising:

a plurality of output pads; and a plurality of signal switch circuits, each of the signal circuits being provided on one of signal paths respectively connected to the output pads, wherein each of the signal switch circuits switches between a first state in which a signal from an upstream side of the signal path is allowed to pass through the signal switch circuit and a second state in which a level pattern of signals from the output pads is fixed to an inspection level pattern, according to a control signal.

Since the inspection level pattern can be supplied from the signal switch circuit provided on the signal path, it is unnecessary to supply the inspection pattern to the driver IC. Moreover, a signal on the upstream side of the signal switch circuit can pass through the signal switch circuit toward the downstream side during the use of the driver IC by setting the signal switch circuit in the through state.

The driver IC may further comprise a level shifter provided on the signal paths, the signal switch circuits being located on an upstream side of the level shifter on the signal paths.

Therefore, since a high breakdown voltage is not required for a transistor which makes up the signal switch circuit, the circuit scale can be reduced.

If the driver IC further comprises a signal source such as a RAM or a shift register for storing logics of signals from the output pads, the signal switch circuits may be located on a downstream side of the signal source on the signal paths.

A signal from the signal source on the upstream side can pass through the signal switch circuit by setting the signal switch circuit in the through state.

In this driver IC, the inspection level pattern may include a level pattern in which signals output from adjacent two of the output pads have different signal levels.

In this driver IC, the output pads may be arranged along a long side of the driver IC in M rows (M is a natural number) which are arranged along a short side of the driver IC; and the inspection level pattern may include a fixed pattern in which signals output from two of the output pads which are adjacent to each other in a direction of the long side of the driver IC have different signal levels.

This enables the pad-to-pad leakage inspection in the signal path connected to the output pads adjacent to each other in the long side direction.

In this driver IC, M may be a natural number greater than one; and the inspection level pattern may include a fixed pattern in which signals output from two of the output pads which are adjacent to each other in a direction of the short side of the driver IC have different signal levels.

This enables the pad-to-pad leakage inspection in the signal path connected to the output pads adjacent to each other in the short side direction.

In this driver IC, the number of the signal switch circuits may be equal to the number of the output pads. This is the case where a binary signal is generated by the driver signal generation section on the upstream side of the signal switch circuit.

In this case, first and second logical signals may be supplied to each of the signal switch circuits as the control signal, and each of the signal switch circuits may select one of the first and second states according to the first logical signal. Each of the signal switch circuits may select the fixed pattern according to the second logical signal when the second state has been selected according to the first logical signal, or may allow a signal from an upstream side of the signal path to pass through the signal switch circuit according to the second logical signal when the first state has been selected according to the first logical signal.

In this case, each of the signal switch circuits may include a first circuit to which the first logical signal and a signal from an upstream side of the signal path are input, and a second circuit to which the second logical signal and an output from the first circuit are input.

When logic gates are used to form the first and second circuits, the first and second circuits may be formed by NAND gates.

In this driver IC, first to fourth control signal lines may be provided in each of the M rows to supply the first or second logical signal to the signal switch circuits the number of which is equal to the output pads;

for the output pads in each of the M rows, odd-numbered signal switch circuits from one end among the signal switch circuits may be connected in common to the first control signal line which supplies the first logical signal and the second control signal line which supplies the second logical signal; and for the output pads in each of the M rows, even-numbered signal switch circuits from one end among the signal switch circuits may be connected in common to the third control signal line which supplies the first logical signal and the fourth control signal line which supplies the second logical signal.

On the other hand, part of the signal paths may include K branched signal lines (K is an integer greater than one) for each of the output pads. This is the case where multi-level signals greater than binary values are generated by the driver signal generation section on the upstream side of the signal switch circuit.

In this case, each of the signal switch circuits may include K circuit blocks respectively provided on the K branched signal lines.

The K circuit blocks may allow signals from an upstream side of the K branched signal lines to pass through the K circuit blocks in the first state, and may set a level pattern of signals passing through the K branched signal lines to the fixed pattern in the second state.

Moreover, first, second, and third logical signals may be supplied to each of the signal switch circuits as the control signal; one of two of the circuit blocks connected to two of the branched signal lines may be controlled by the first and second logical signals, the other of the two circuit blocks being controlled by the first and third logical signals, and (K-2) remaining circuit blocks (K is an integer greater than two) being controlled by the control signal. The K circuit blocks may select one of the first and second states according to the first logical signal; when the second state has been selected, the two circuit blocks may select the fixed pattern according to the second and third logical signals, and an output potential from the (K-2) remaining circuit blocks may be fixed to a constant value; and when the first state has been selected, the two circuit blocks may allow signals from an upstream side of the branched signal lines to pass through the two circuit blocks according to the second logical signal, and the (K-2) remaining circuit blocks may allow signals from an upstream side of the branched signal lines to pass through the (K-2) remaining circuit blocks according to the first logical signal.

For such control, first to sixth control signal lines may be provided in each of the M rows to supply the first, second or third logical signal to the signal switch circuits. For the output pads in each of the M rows, odd-numbered signal switch circuits from one end among the signal switch circuits may be connected in common to the first control signal line which supplies the first logical signal, the second control signal line which supplies the second logical signal and the third control signal line which supplies the third logical signal; and for the output pads in each of the M rows, even-numbered signal switch circuits from one end among the signal switch circuits may be connected in common to the fourth control signal line which supplies the first logical signal, the fifth control signal line which supplies the second logical signal and the sixth control signal line which supplies the third logical signal.

According to one embodiment of the present invention, there is provided a method of inspecting any of the above-described driver ICs, wherein the driver IC is inspected by: setting the driver IC to the first state; supplying signals having the inspection level pattern through the signal paths to the output pads; and causing the signals to be output from the output pads.

When the inspection signal level includes a level which causes the signal levels output from adjacent two output pads to differ, the pad-to-pad leakage inspection can be performed.

According to one embodiment of the present invention, there is provided a method of inspecting an output device, wherein the output device is inspected by: setting any of the above-described driver ICs to the first state; connecting the output device driven by the driver IC to the driver IC; supplying signals having the inspection level pattern through the signal paths of the driver IC to the output pads; and causing the signals to be output from the output pads.

These embodiments will be described in detail below with reference to the drawings.

Output Pad Arrangement and Pad-to-Pad Leakage Test

FIG. 1 shows an output pad region 12 provided along the long side of a driver IC 10, for example. The output pads provided in the output pad region 12 are disposed in various types of arrangements as described below.

Figure 2:
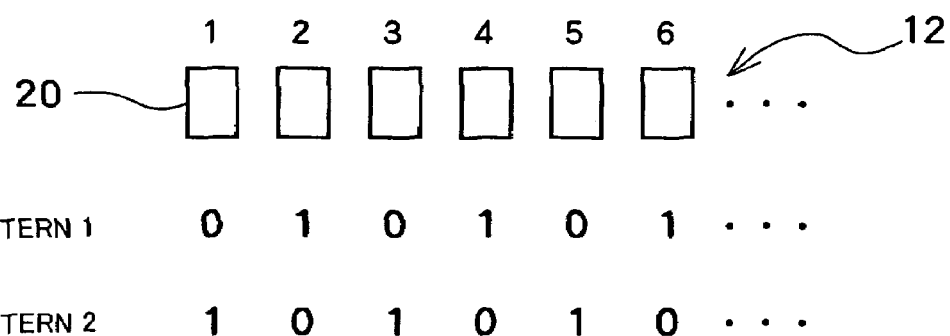
FIG. 2 shows a one-line straight arrangement of output pads in the output pad region shown in FIG. 1 and patterns 1 and 2 used for pad-to-pad leakage inspection.

FIG. 2 shows a "one-line straight arrangement" in which output pads 20 are arranged in the output pad region 12 in one line in the horizontal direction. A signal pattern used for the pad-to-pad leakage test is a pattern 1 type consisting of "0, 1, 0, 1, . . . " or a pattern 2 type consisting of "1, 0, 1, 0, . . . " in the order from the output pad 20 on the left end, as shown in FIG. 2. A signal output from the output pad 20 is an analog value. However, the signals in the patterns 1 and 2 are indicated by digital values. The same applies to signal patterns described below.

Figure 3:
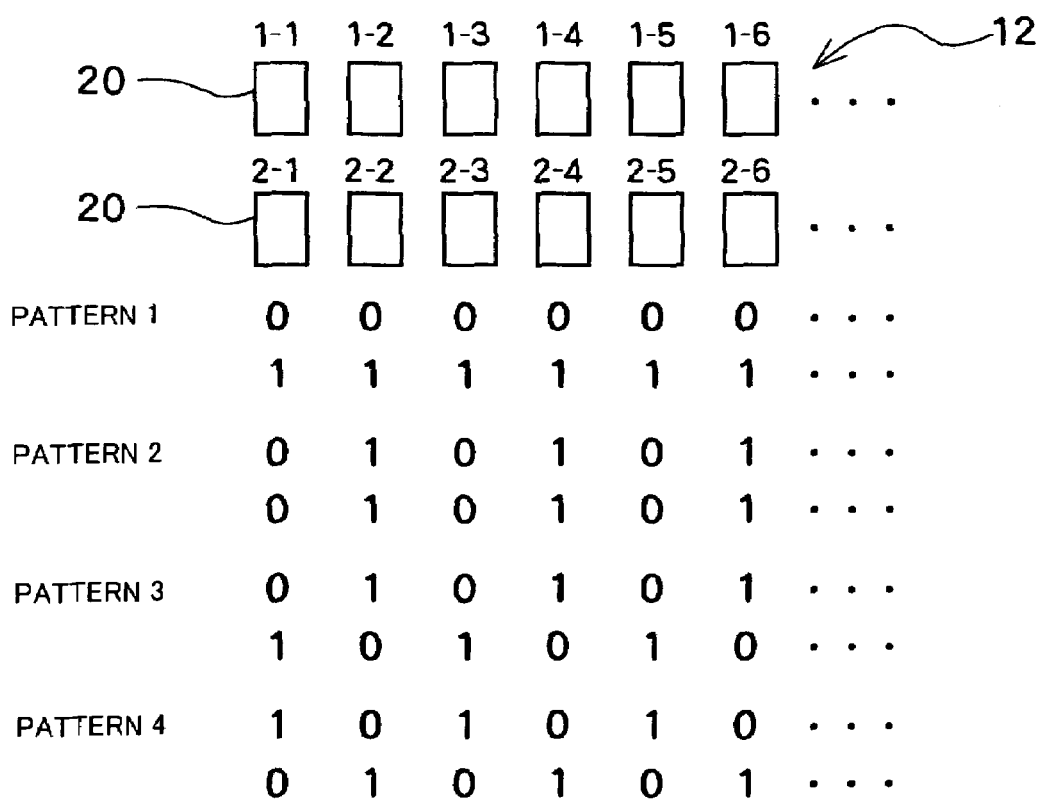
FIG. 3 shows a parallel two-line straight arrangement of output pads in the output pad region shown in FIG. 1 and patterns 1 to 4 used for pad-to-pad leakage inspection.

FIG. 3 shows a "parallel two-line straight arrangement" in which the output pads 20 are arranged in the output pad region 12 along the direction of the long side of the driver IC 10 in two rows in the direction of the short side of the driver IC 10. A signal pattern used for the pad-to-pad leakage test is a pattern 1 type in which the upper row is "0, 0, 0, . . . " and the lower row is "1, 1, 1, . . . ", a pattern 2 type in which the upper and lower rows are "0, 1, 0, . . . ", a pattern 3 type in which the upper row is "0, 1, 0, . . . " and the lower row is "0, 1, 0, . . . ", or a pattern 4 type in which the upper row is "1, 0, 1, . . . " and the lower row is "1, 0, 1, . . . " in the order from the output pad 20 on the left end, as shown in FIG. 3. In the pattern 1 shown in FIG. 3, the pad-to-pad leakage test in the path connected with the output pads 12 adjacent to each other in the direction of the short side of the driver IC 10 can be performed. In the pattern 2 shown in FIG. 3, the pad-to-pad leakage test in the path connected with the output pads 12 adjacent to each other in the direction of the long side of the driver IC 10 can be performed. In the patterns 3 and 4 shown in FIG. 3, the pad-to-pad leakage test in the paths connected with the output pads 12 adjacent to each other in the directions of the short side and the long side of the driver IC 10 can be performed.

Figure 4:
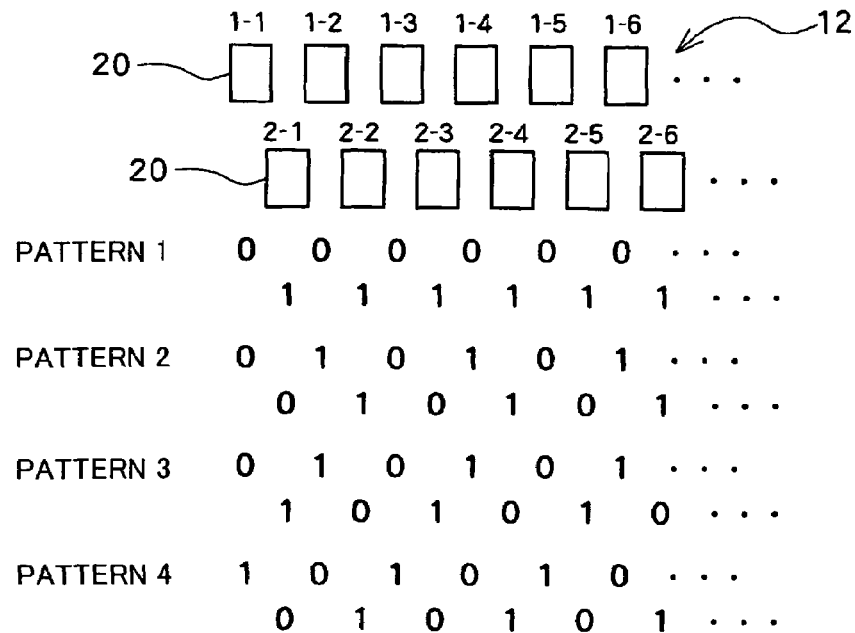
FIG. 4 shows a parallel two-line staggered arrangement of output pads in the output pad region shown in FIG. 1 and patterns 1 to 4 used for pad-to-pad leakage inspection.

FIG. 4 shows a "parallel two-line staggered arrangement" which is a modification of the "parallel two-line straight arrangement" shown in FIG. 3 and in which the positions of the output pads 20 in the lower row in the "parallel two-line straight arrangement" shown in FIG. 2 are shifted at a half pitch in the direction of the long side of the driver IC 10. The signal patterns 1 to 4 shown in FIG. 4 used for the pad-to-pad leakage test are substantially the same as the signal patterns 1 to 4 shown in FIG. 3.

Figure 5:
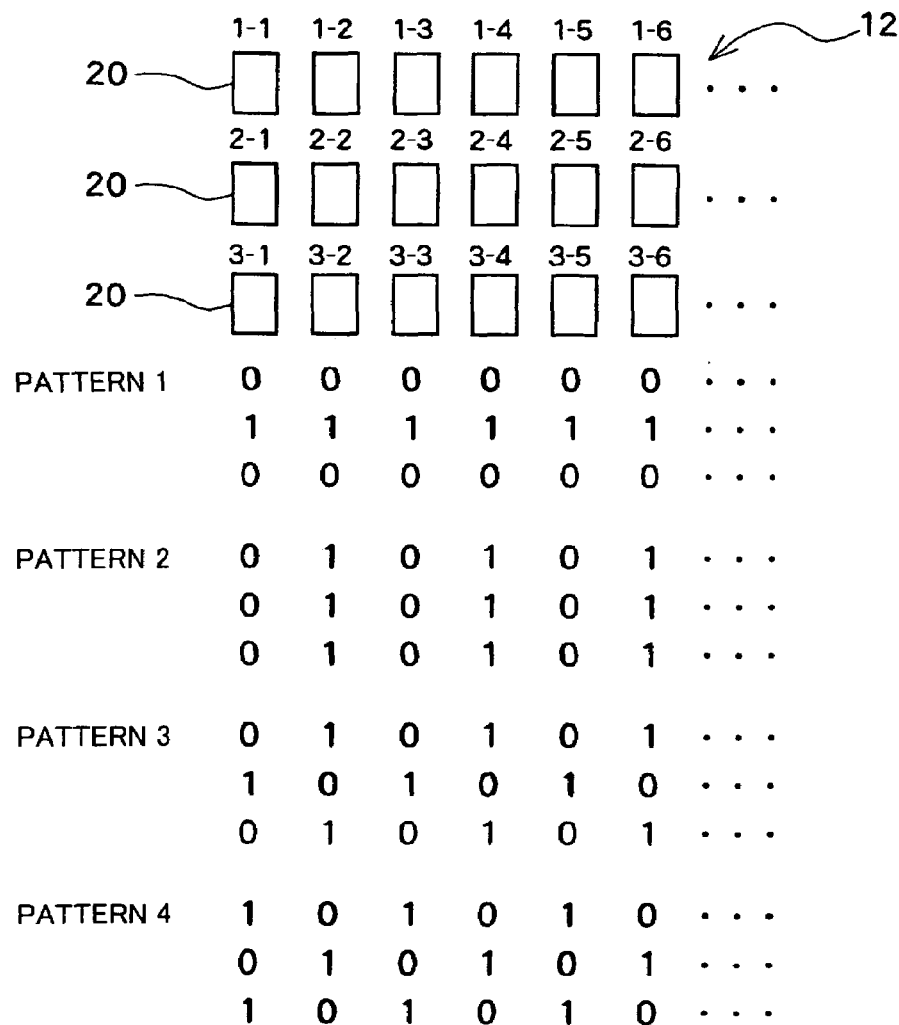
FIG. 5 shows a parallel three-line straight arrangement of output pads in the output pad region shown in FIG. 1 and patterns 1 to 4 used for pad-to-pad leakage inspection.

FIG. 5 shows a "parallel three-line straight arrangement" in which one row is further added to the "parallel two-line straight arrangement" shown in FIG. 3. The signal patterns 1 to 4 shown in FIG. 5 used for the pad-to-pad leakage test are substantially the same as the signal patterns 1 to 4 shown in FIG. 3 except that the number of rows of the output pads 20 is increased by one.

In FIGS. 2 to 5, the presence or absence of pad-to-pad leakage is-determined by causing the signal levels output from adjacent two outputs pads 20 to differ, such as "0" and "1", and measuring the entire current which flows from a power supply in the driver IC 10.

In the conventional technology, when inspecting the patterns 1 to 4 shown in FIG. 3, for example, programming of "writing of pattern 1 into RAM→display setting→display ON→writing of pattern 2 into RAM→display setting→display ON→writing of pattern 3 into RAM→display setting→display ON→writing of pattern 4 into RAM→display setting→display ON" is necessary.

Signal Switch Circuit on Signal Path

Figures 6, 7:
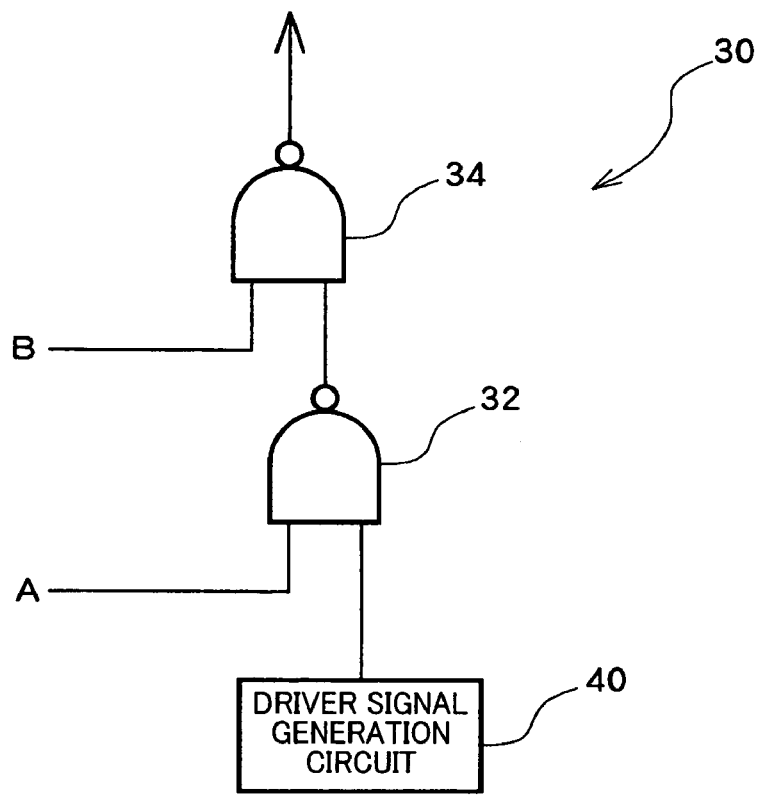
FIG. 6 is a circuit diagram showing an example of a signal switch circuit.
FIG. 7 is a table for illustrating an operation state of the signal switch circuit shown in FIG. 6.

FIG. 6 shows a signal switch circuit 30 added on the signal path connected with the output pads 20 shown in FIGS. 2 to 5.

The signal switch circuit 30 switches between a first state in which the signal switch circuit 30 allows a signal from the upstream side, such as from the driver signal generation circuit 40, to pass therethrough and a second state in which the signal switch circuit 30 fixes a signal level pattern to an inspection level pattern, according to a control signal. The inspection level pattern is a level pattern which causes levels of signals output from adjacent two outputs pads 20 in the output pad region 12 shown in FIG. 1 to differ, and is a fixed pattern of "0" or "1" indicated by various patterns shown in FIGS. 2 to 5.

The signal switch circuits 30 shown in FIG. 6 are provided in the number the same as the number of output pads 20 in the output pad region 12 shown in FIG. 1. In this case, first and second logical signals A and B are supplied to each of the signal switch circuits 30 as the control signals.

The signal switch circuit 30 selects one of the first and second states according to the first logical signal A. If the second state is selected according to the first logical signal A, a fixed pattern ("0" or "1") is selected according to the second logical signal, and if the first state is selected according to the first logical signal A, signals from the driver signal generation circuit 40 on the upstream side are allowed to pass through according to the second logical signal B.

In FIG. 6, the signal switch circuit 30 includes a first circuit 32 (first NAND gate) to which the first logical signal A and a signal from the driver signal generation circuit 40 are input, and a second circuit 34 (second NAND gate) to which the second logical signal B and an output from the first NAND gate circuit 32 are input.

FIG. 7 shows a truth table of the signal switch circuit 30 shown in FIG. 6. As shown in FIG. 7, when the first logical signal A is set at "1", the first state in which the signal from the driver signal generation circuit 40 is output through the first and second NAND gates 32 and 34 is selected by setting the second logical signal B at "1" ("A=1 and B=0" is not used). Specifically, when a user uses the driver IC 10, the signal on the upstream side of the signal switch circuit 30 can be directed through he signal switch circuit 30 toward the downstream side by always setting the signal switch circuit 30 in the first state, whereby the driver IC 10 can be used normally.

The first logical signal is set at "0" at the time of inspection such as the pad-to-pad leakage inspection. In this case, the output from the signal switch circuit 30 is fixed at "HIGH" as shown in FIG. 7 by setting the second logical signal B at "0", whereby the inspection signal level of "1" can be output from the output pad 20. The output from the signal switch circuit 30 is fixed at "LOW" as shown in FIG. 7 by setting the second logical signal B at "1", whereby the inspection signal level of "0" can be output from the output pad 20.

Relationship Between Output Pad Arrangement and Control Signal Line

It suffices to provide four control signal lines, which supply the first and second logical signals A and B to the signal switch circuits 30 provided in the driver IC 10, for each of M (M is a natural number) rows ((4×M) in total).

Specifically, four control signal lines in total are provided in FIG. 2 (M=1), eight control signal lines in total are provided in FIGS. 3 and 4 (M=2), and 12 control signal lines in total are provided in FIG. 5 (M=3).

Figure 8:
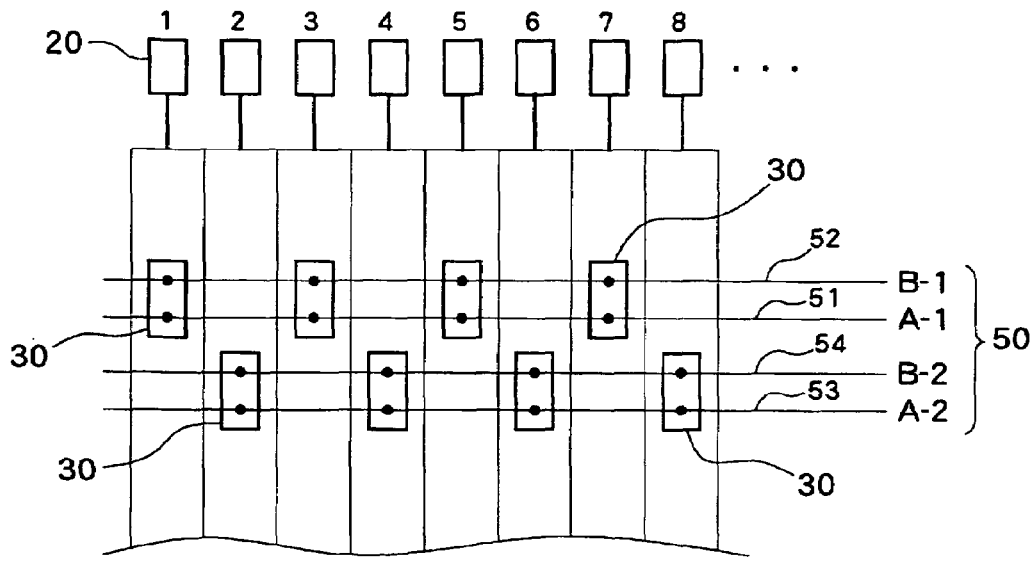
FIG. 8 shows a connection of control signal lines of a driver IC in which output pads are disposed in the one-line straight arrangement shown in FIG. 2.

FIG. 8 shows control signal lines 50 used in the one-line straight arrangement shown in FIG. 2. As shown in FIG. 8, a first control signal line 51 which supplies a first logical signal (A-1) and a second control signal line 52 which supplies a second logical signal (B-1) are connected in common with the signal switch circuits 30 corresponding to the output pads 20 which are odd-numbered from one end, and a third control signal line 53 which supplies a first logical signal (A-2) and a fourth control signal line 54 which supplies a second logical signal (B-2) are connected in common with the signal switch circuits 30 corresponding to the output pads 20 which are even-numbered from one end.

Figure 9:
FIG. 9 shows a logic of the control signal lines shown in FIG. 8 and an output state of the pattern 1 shown in FIG. 2.
Figure 9:
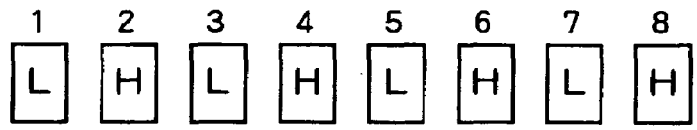
Figure 10:
FIG. 10 shows a logic of the control signal lines shown in FIG. 8 and an output state of the pattern 2 shown in FIG. 2.
Figure 10:
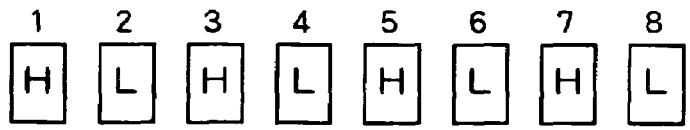

This interconnection arrangement allows the inspection level pattern of the odd-numbered output pad 20 to differ from the inspection level pattern of the even-numbered output pad 20, whereby the inspection of the patterns 1 and 2 shown in FIG. 2 can be performed. Specifically, the inspection of the patterns 1 and 2 shown in FIG. 2 can be performed by setting the logical signals (A-1) to (B-2) as shown in FIGS. 9 and 10, even if the signal pattern is not input from the outside. The signal switch circuit 30 allows the signal on the upstream side to pass therethrough toward the downstream side if all the logical signals (A-1) to (B-2) are set at "1", whereby the driver IC 10 can be used normally.

Figure 11:
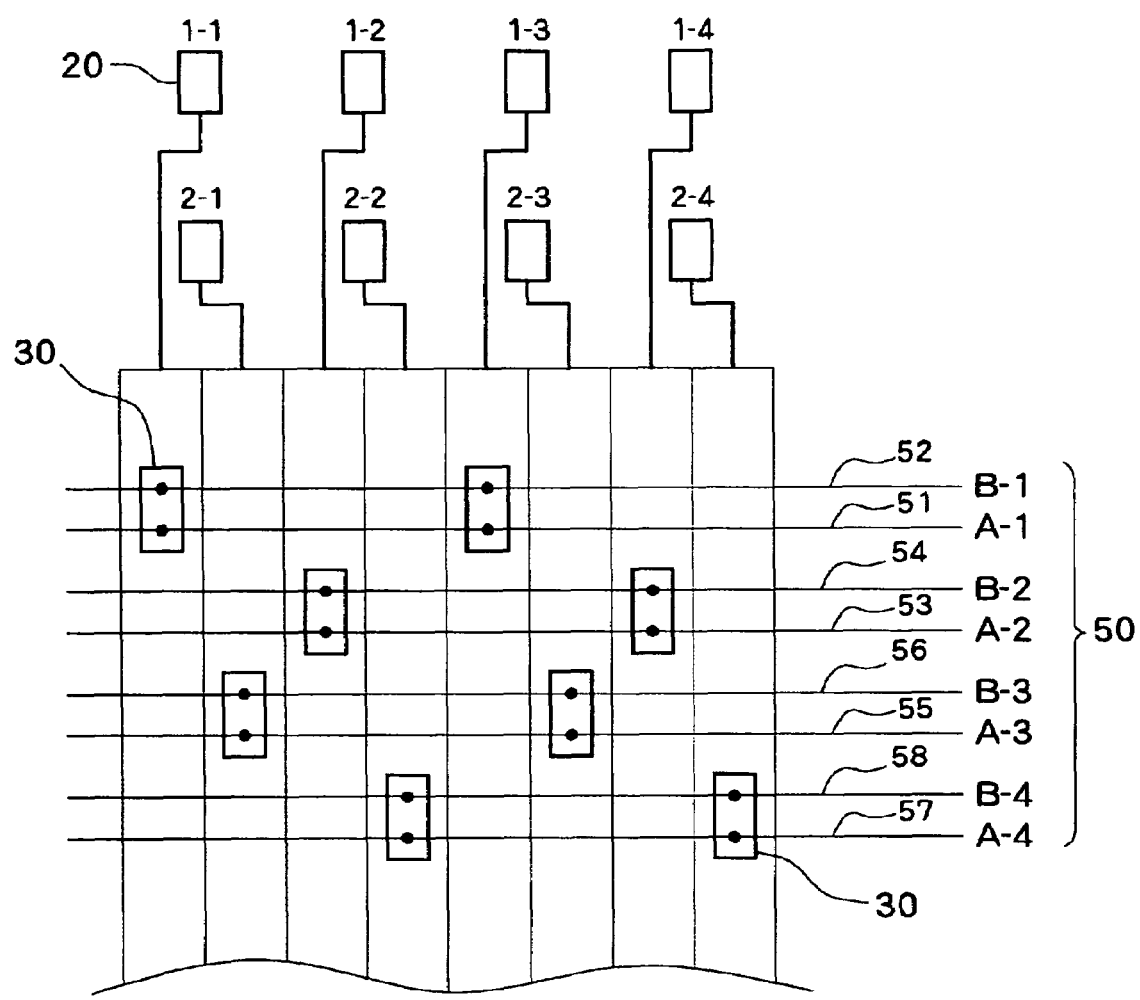
FIG. 11 shows a connection of control signal lines of a driver IC in which output pads are disposed in the parallel two-line straight arrangement shown in FIG. 3 or in the parallel two-line staggered arrangement shown in FIG. 4.

FIG. 11 shows the control signal lines 50 used in the parallel two-line straight arrangement shown in FIG. 3. As shown in FIG. 11, the first control signal line 51 which supplies the first logical signal (A-1) and the second control signal line 52 which supplies the second logical signal (B-1) are connected in common with the signal switch circuits 30 corresponding to the output pads 20 in the first row which are odd-numbered from one end. The first control signal line 53 which supplies the first logical signal (A-2) and the fourth control signal line 54 which supplies the second logical signal (B-2) are connected in common with the signal switch circuits 30 corresponding to the output pads 20 in the first row which are even-numbered from one end.

In FIG. 11, a fifth control signal line 55 which supplies a first logical signal (A-3) and a sixth control signal line 56 which supplies a second logical signal (B-3) are connected in common with the signal switch circuits 30 corresponding to the output pads 20 in the second row which are odd-numbered from one end. A seventh control signal line 57 which supplies a first logical signal (A-4) and an eighth control signal line 58 which supplies a second logical signal (B-4) are connected in common with the signal switch circuits 30 corresponding to the output pads 20 in the second row which are even-numbered from one end.

Figure 12:
FIG. 12 shows a logic of the control signal lines shown in FIG. 11 and an output state of the pattern 1 shown in FIG. 3.
Figure 13:
FIG. 13 shows a logic of the control signal lines shown in FIG. 11 and an output state of the pattern 3 shown in FIG. 3.

This interconnection arrangement allows the inspection level patterns of the output pads 20 which make up one set consisting of two rows and two columns to differ, whereby the inspection of the patterns 1 to 4 shown in FIG. 3 can be performed. For example, the inspection of the patterns 1 and 3 shown in FIG. 3 can be performed by setting the logical signals (A-1) to (B-2) as shown in FIGS. 12 and 13, even if the signal pattern is not input from the outside. The signal switch circuit 30 allows the signal on the upstream side to pass through toward the downstream side if all the logical signals (A-1) to (B-4) are set at "1", whereby the driver IC 10 can be used normally.

The parallel two-line staggered arrangement shown in FIG. 4 can be inspected by using the control signal lines shown in FIG. 11.

Figure 14:
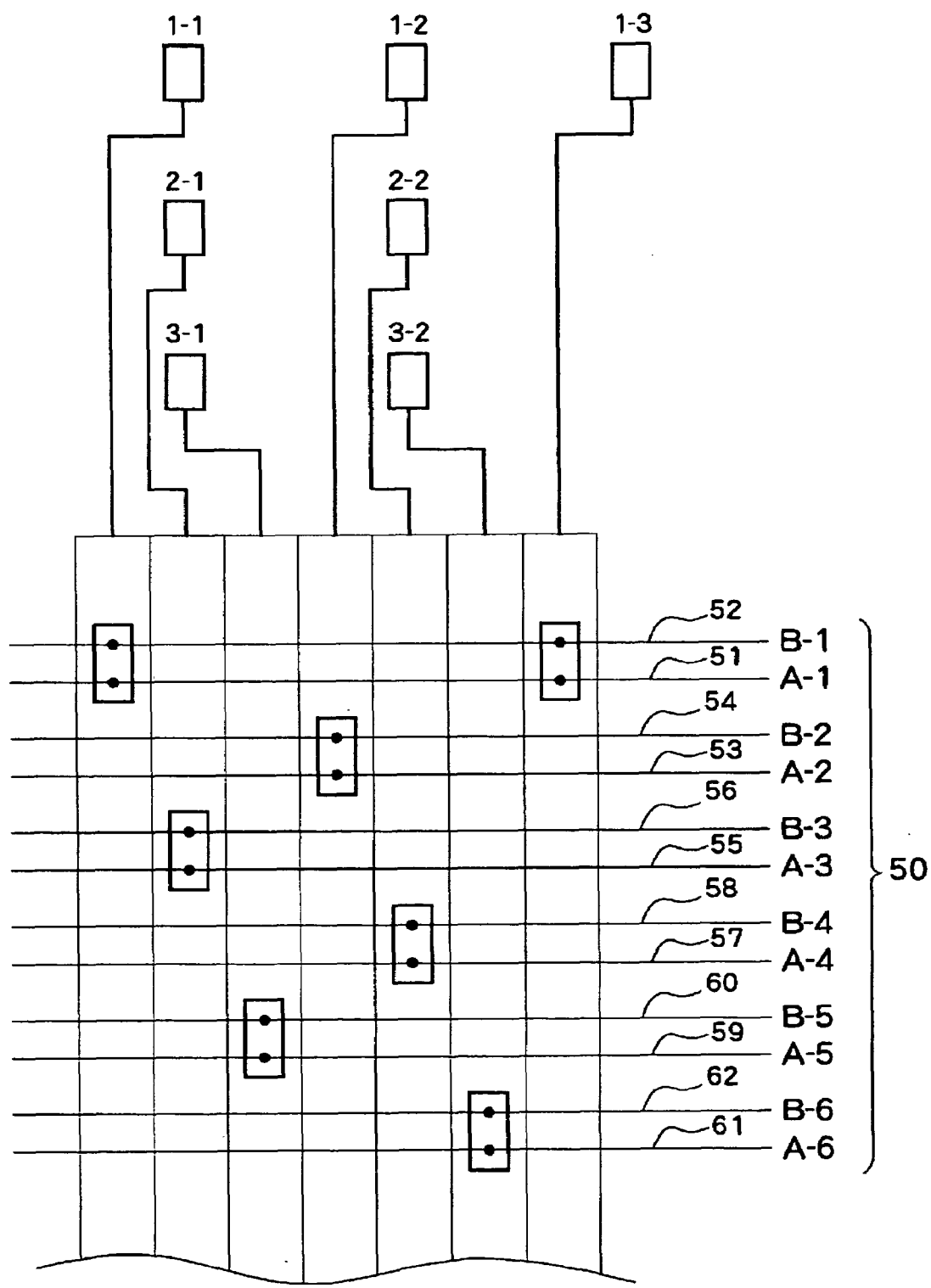
FIG. 14 shows a connection of control signal lines of a driver IC in which output pads are disposed in the parallel three-line straight arrangement shown in FIG. 5.

FIG. 14 shows the control signal lines 50 used in the parallel three-line straight arrangement shown in FIG. 5. In FIG. 14, a ninth control signal line 59 which supplies a first logical signal (A-5) and a tenth control signal line 60 which supplies a second logical signal (B-5) are connected in common with the signal switch circuits 30 corresponding to the output pads 20 in the third row which are odd-numbered from one end, in addition to the control signal lines 51 to 58 shown in FIG. 11. An eleventh control signal line 61 which supplies a first logical signal (A-6) and a twelfth control signal line 62 which supplies a second logical signal (B-6) are connected in common with the signal switch circuits corresponding to the output pads 20 in the third row which are even-numbered from one end.

In FIG. 14, the fifth control signal line 55 which supplies the first logical signal (A-3) and the sixth control signal line 56 which supplies the second logical signal (B-3) are connected in common with the signal switch circuits 30 corresponding to the output pads 20 in the second row which are odd-numbered from one end. The seventh control signal line 57 which supplies the first logical signal (A-4) and the eighth control signal line 58 which supplies the second logical signal (B-4) are connected in common with the signal switch circuits corresponding to the output pads 20 in the second row which are even-numbered from one end.

Figure 15:
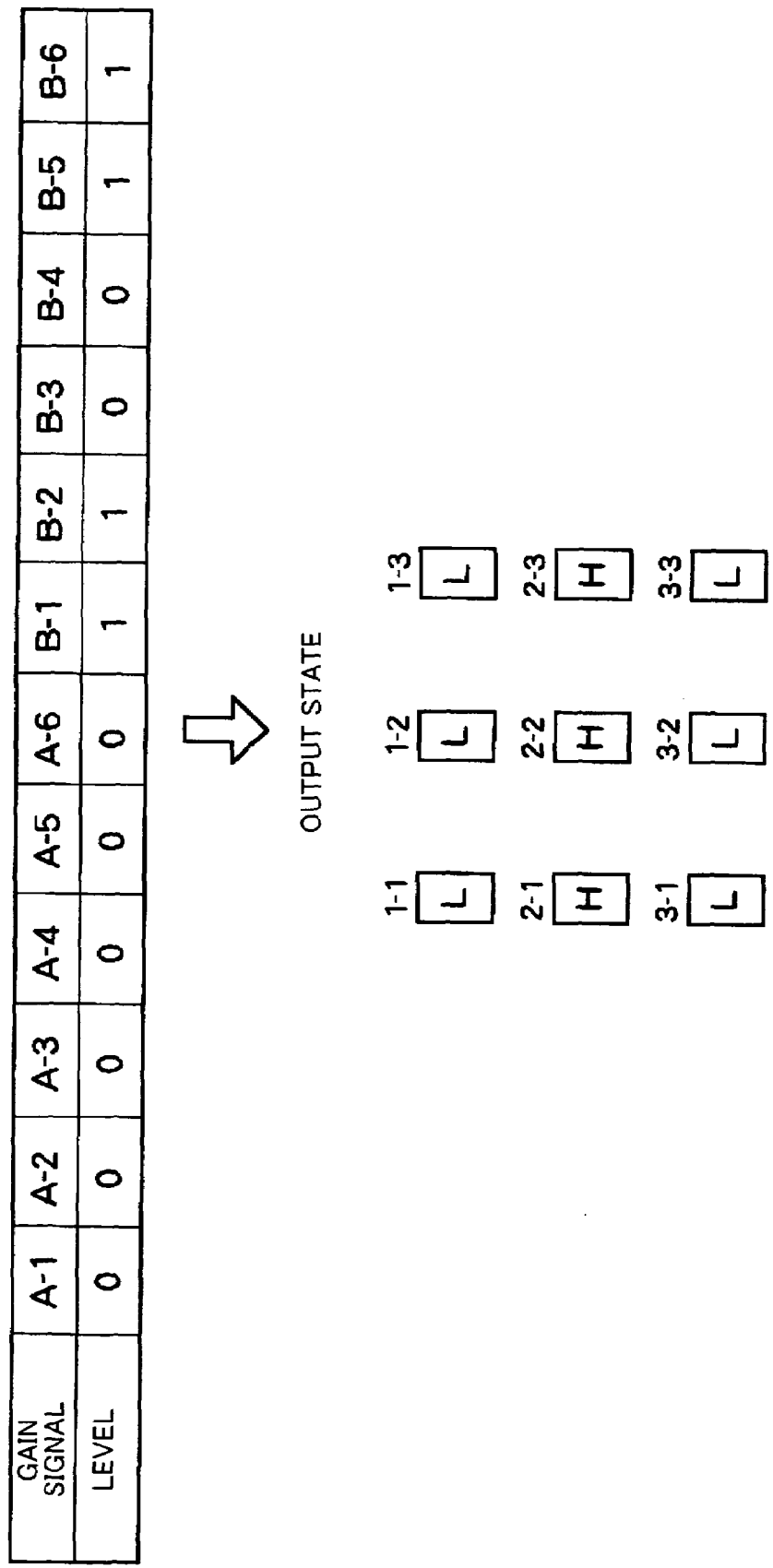
FIG. 15 shows a logic of the control signal lines shown in FIG. 14 and an output state of the pattern 1 shown in FIG. 5.
Figure 16:
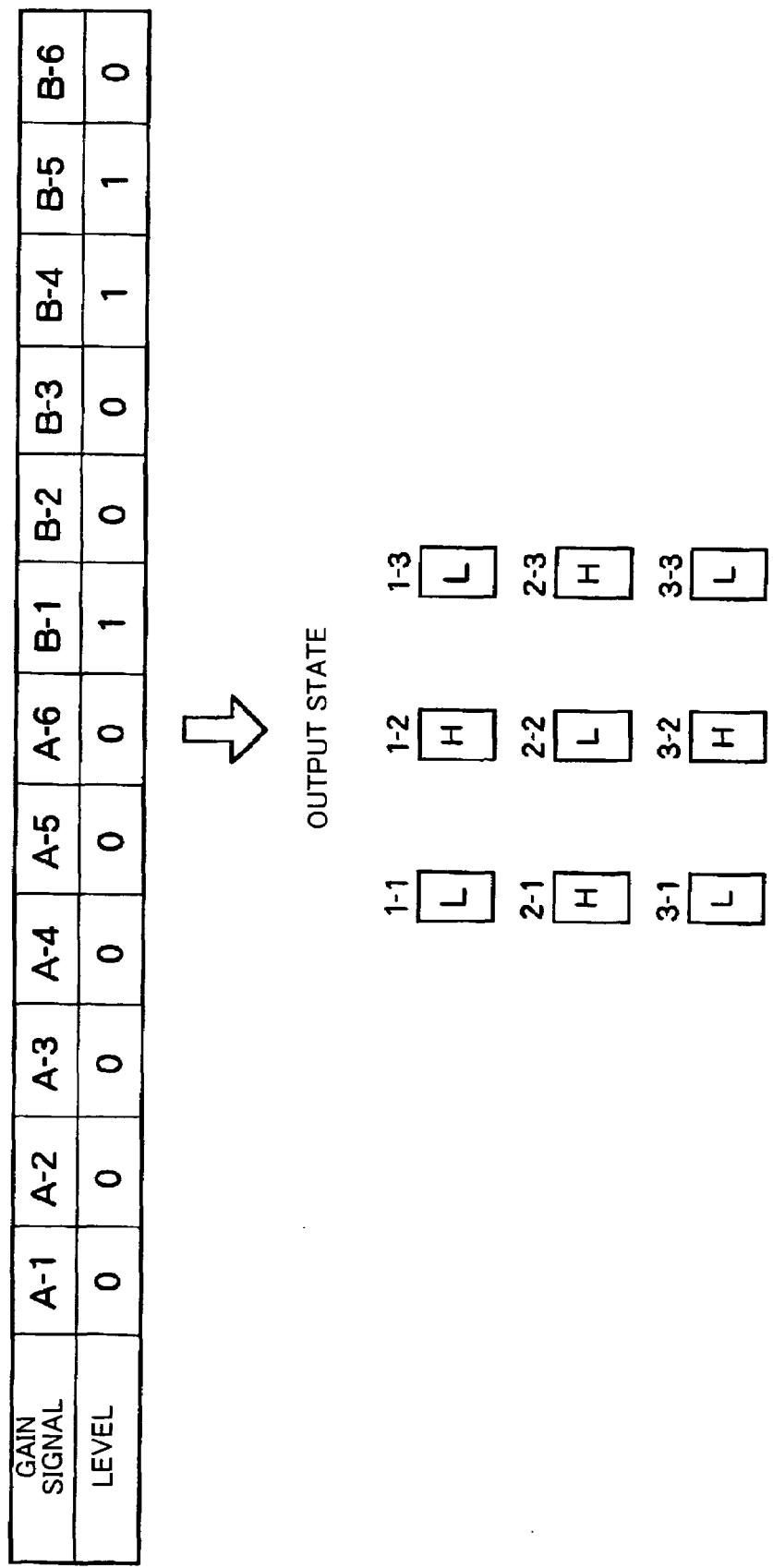
FIG. 16 shows a logic of the control signal lines shown in FIG. 14 and an output state of the pattern 3 shown in FIG. 5.

This interconnection arrangement allows the inspection level patterns of the output pads 20 which make up one set consisting of three rows and three columns to differ, whereby the inspection of the patterns 1 to 4 shown in FIG. 5 can be performed. For example, the inspection of the patterns 1 and 3 shown in FIG. 5 can be performed by setting the logical signals (A-1) to (B-2) as shown in FIGS. 15 and 16, even if the signal pattern is not input from the outside. The signal switch circuit 30 allows the signal on the upstream side to pass therethrough toward the downstream side if all the logical signals (A-1) to (B-4) are set at "1", whereby the driver IC 10 can be used normally.

Driver IC

Figure 17:
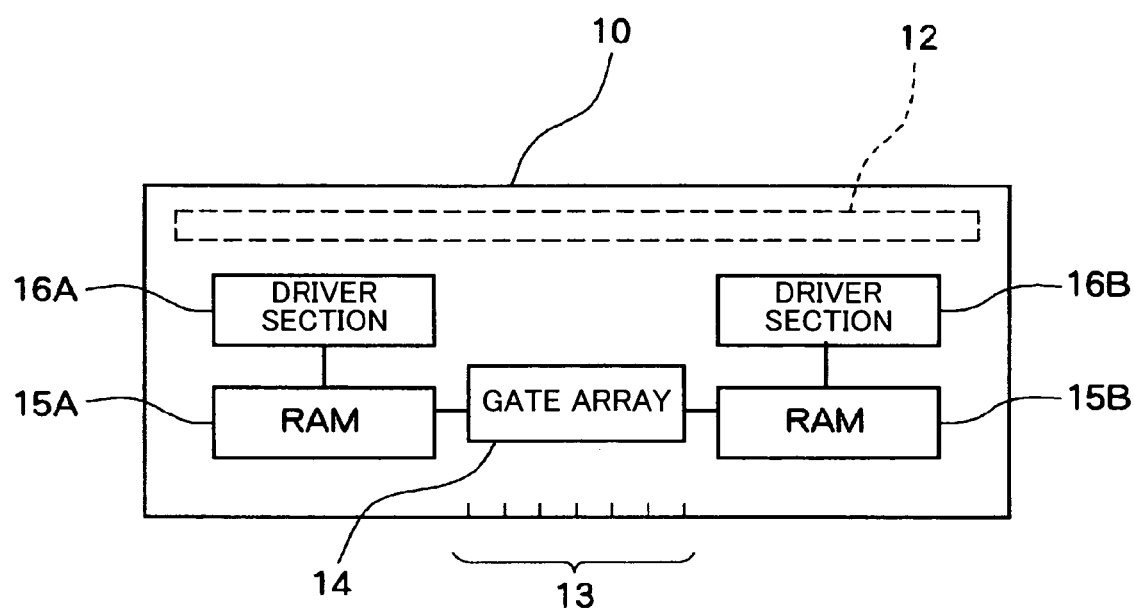
FIG. 17 is a block diagram showing an example of the driver IC shown in FIG. 1.

FIG. 17 is a block diagram showing an example of the entire configuration of the display driver IC 10, for example. The driver IC 10 includes data input terminals 13 on the long side opposite to the long side on which the output pad region 12 is formed. A gate array 14 is connected with the data input terminals 13. Two RAMs 15A and 15B are connected with the gate array 14, and display data is written into the RAMs 15A and 15B, for example. Driver sections 16A and 16B are respectively connected with the RAMs 15A and 15B. The driver sections 16A and 16B generate display signals based on the display data read from the RAMs 15A and 15B, and output the generated display signals through the output pads 20.

Figure 18:
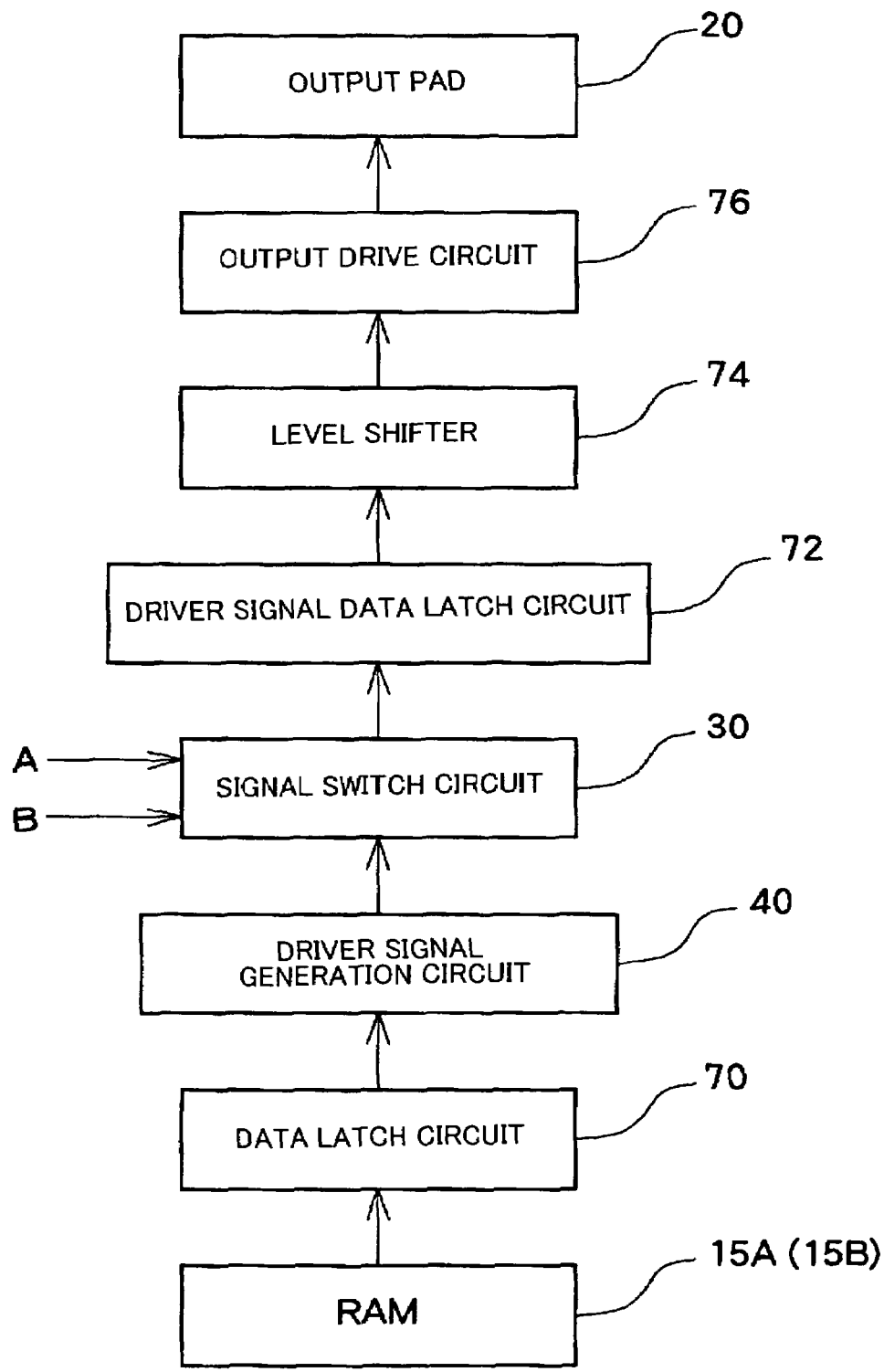
FIG. 18 is a block diagram showing an example of the driver section shown in FIG. 17.

FIG. 18 shows an example of the driver sections 16A and 16B. A data latch circuit 70, the driver signal generation circuit 40, the signal switch circuit 30, a driver signal data latch circuit 72, a level shifter 74, an output drive circuit 76, and the output pad 20 are provided in a signal path on the downstream side of the RAM 15A. In this embodiment, an inspection command is input through the data input terminal 13, and data for setting the above-described control signal is input at the time of inspection. Therefore, it is unnecessary to input an inspection signal level pattern or the like, differing from the conventional technology.

In this embodiment, it is preferable to provide the signal switch circuit 30 on the signal path on the upstream side of the level shifter 76. The signal switch circuit 40 may be provided on the downstream side of the level shifter 74. However, this makes it necessary to form a transistor which makes up the signal switch circuit 30 using a high-voltage transistor, whereby the circuit scale is increased.

The signal switch circuit 30 is provided in the signal path on the downstream side of the RAM 15A as a signal source. In this embodiment, the signal switch circuit 30 is provided on the downstream side of the driver signal generation circuit 40 which outputs binary digital data corresponding to the analog signal level output from the output pad 20. As the driver signal generation circuit 40 which outputs the binary digital data, a circuit which generates the driver signal by pulse width modulation (PWM) or frame rate control (FLC) can be given. The signal switch circuit 30 may be provided on the downstream side of the driver signal data latch circuit 72.

Driver Signal Generation Circuit Which Outputs Multi-Level Values

Figure 19:
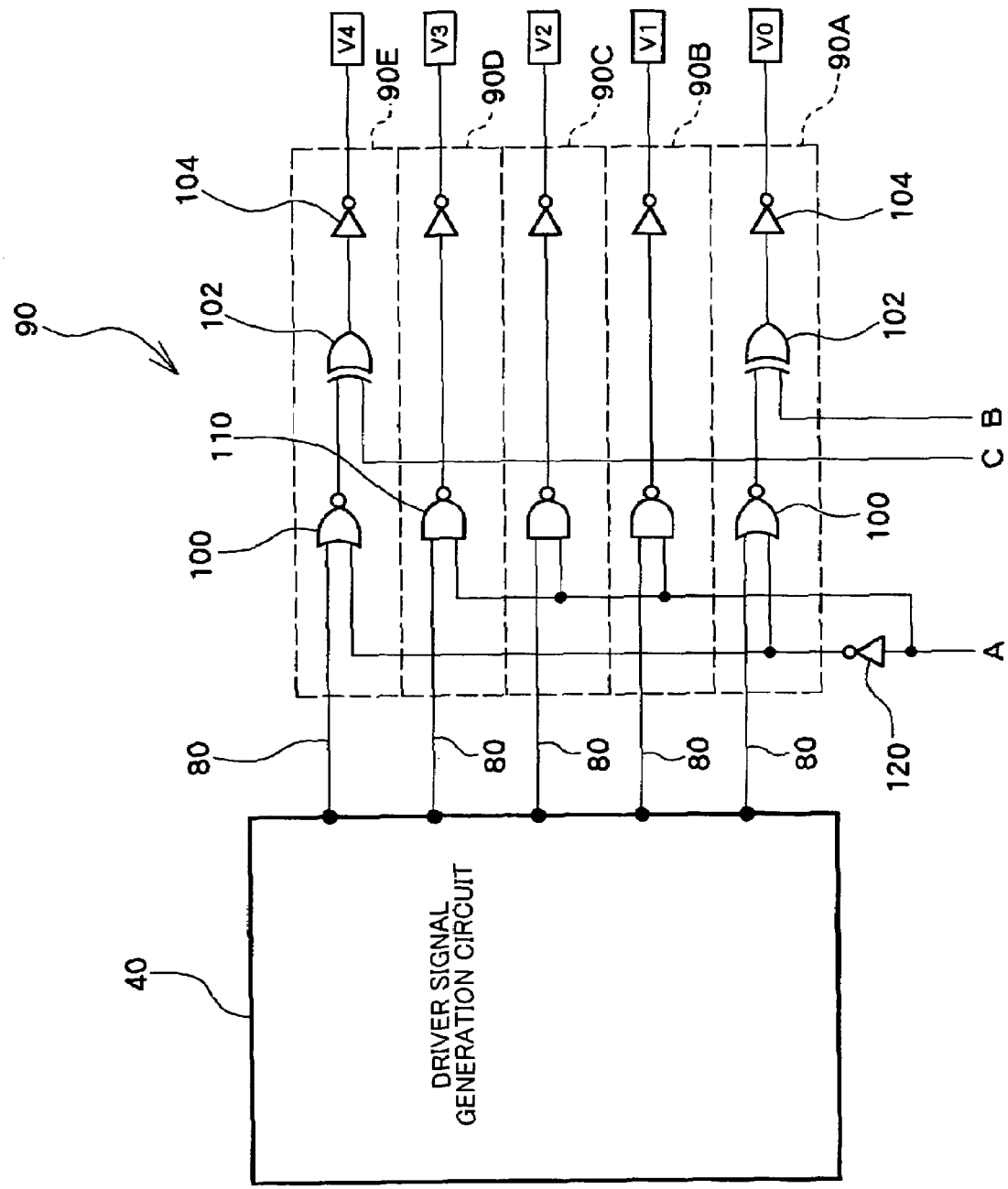
FIG. 19 is a circuit diagram showing a signal switch circuit including circuit blocks connected to branched signal lines of a driver signal generation circuit which outputs multi-level values.

In a multi-line selection (MLS) method or the like, the output from the driver signal generation circuit 40 shown in FIG. 19 consists of multi-level values, and K (K is an integer of two or more) signal lines (branched signal lines) are provided for one output pad 20.

FIG. 19 shows an example of a signal switch circuit 90 to which K=5 branched signal lines 80 are provided from the driver signal generation circuit 40 corresponding to one output pad 20, and which includes five circuit blocks 90A to 90E connected with the five branched signal lines 80.

The five circuit blocks 90A to 90E allow the signal from the driver signal generation circuit 40 to pass through in the first state, and set the level pattern of signals passing through the five branched signal lines 80 to a fixed pattern in the second state in the same manner as described above.

At the time of inspection (second state), it suffices that the inspection level pattern of two of the five branched signal lines be changed to "0" or "1", and the inspection level pattern of the remaining three branched signal lines 80 be a constant value of "0".

In FIG. 19, the signal switch circuit 90 is configured so that the inspection level pattern can be selected by the circuit blocks 90A and 90E, and each of the circuit blocks 90A and 90E includes a first NOR gate 100, a second NOR gate 102, and an inverter 104. Each of the remaining circuit blocks 90B, 90C, and 90D includes a NAND gate 110 and the inverter 104.

The first logical signal A, the second logical signal B, and a third logical signal C are supplied to the signal switch circuit 90 shown in FIG. 19 as the control signals. In the circuit block 90A, the first logical signal A is input to the first NOR gate 100 through the inverter 120, and the second logical signal B is input to the second NOR gate 102. In the circuit block 90E, the first logical signal A is input to the first NOR gate 100 through the inverter 120, and the third logical signal C is input to the second NOR gate 102. In the circuit blocks 90B, 90C, and 90D, the first logical signal A is input to the NAND gate 110.

FIG. 20 shows an operation state of the signal switch circuit 90 shown in FIG. 19. In the five circuit blocks 90A to 90D, the first state (through state) is selected when the first logical signal A is set at "0". In this case, the second and third logical signals B and C are set at "0", whereby the signal on the upstream side passes through the signal switch circuit 90 toward the downstream side.

In the five circuit blocks 90A to 90D, the second state (inspection state) is selected when the first logical signal A is set at "1". In this case, the outputs from the circuit blocks 90B, 90C, and 90D are fixed at "0". The circuit blocks 90A and 90E are fixed at "0" or "1" by the logic of the second and third logical signals B and C.

When the signal switch circuit 40 shown in FIG. 19 is used, the number of control signal lines is six for each of the M rows ((6×M) in total). Specifically, the total number of control signal lines is six ((A-1) to (C-2)) in the "one-line straight arrangement" shown in FIG. 2, the total number of control signal lines is 12 ((A-1) to (C-4)) in the "parallel two-line straight arrangement" shown in FIG. 3 and the "parallel two-line staggered arrangement" shown in FIG. 4, and the total number of control signal lines is 18 ((A-1) to (C-6)) in the "parallel three-line straight arrangement" shown in FIG. 5.

Inspection Method for Output Device

An output device connected with the above-described driver IC, such as a display device including a liquid crystal panel, organic EL panel, or LCD, or a printer, can be inspected by applying a signal through the output pad 20 of the driver IC 10. In this case, the inspection level pattern can be generated by the signal switch circuit 40, whereby complex programming for forming an inspection level pattern becomes unnecessary. In this case, functional inspection of the output device can be performed by displaying a predetermined pattern when the output device is a display device, or performing a predetermined print operation when the output device is a printer.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention.

For example, the driver IC 10 is not necessarily limited to a driver IC which includes a RAM. The signal source may be a shift register which transfers data from the outside or the like. The driver IC to which the present invention is applied is not necessarily limited to a signal driver IC which transmits display data or print data. For example, the driver IC may be a scan driver IC used to make a pair with a signal driver IC.

What is claimed is:

1. A driver IC comprising:
    a plurality of output pads; and a plurality of signal switch circuits, each of the signal switch circuits being provided on one of signal paths respectively connected to the output pads,
    wherein each of the signal switch circuits switches between a first state in which a signal from an upstream side of the signal path is allowed to pass through the signal switch circuit and a second state in which a level pattern of signals from the output pads is fixed to an inspection level pattern, according to a control signal;
    wherein the inspection level pattern includes a level pattern in which signals output from adjacent two of the output pads have different signal levels; the output pads are arranged along a long side of the driver IC in M rows (M is a natural number) which are arranged along a short side of the driver IC;
    the inspection level pattern includes a fixed pattern in which signals output from two of the output pads which are adjacent to each other in a direction of the long side of the driver IC have different signal levels;
    M is a natural number greater than one; and the inspection level pattern includes a fixed pattern in which signals output from two of the output pads which are adjacent to each other in a direction of the short side of the driver IC have different signal levels.

2. The driver IC as defined in claim 1, further comprising a level shifter provided on the signal paths, the signal switch circuits being located on an upstream side of the level shifter on the signal paths.

3. The driver IC as defined in claim 1, further comprising a RAM which stores logics of signals from the output pads, the signal switch circuits being located on a downstream side of the RAM on the signal paths.

4. The driver IC as defined in claim 1, wherein:
    the number of the signal switch circuits is equal to the number of the output pads;
    first and second logical signals are supplied to each of the signal switch circuits as the control signal;
    each of the signal switch circuits selects one of the first and second states according to the first logical signal; and
    each of the signal switch circuits selects the fixed pattern according to the second logical signal when the second state has been selected according to the first logical signal, or allows a signal from an upstream side of the signal path to pass through the signal switch circuit according to the second logical signal when the first state has been selected according to the first logical signal.

5. The driver IC as defined in claim 4, wherein each of the signal switch circuits includes a first circuit to which the first logical signal and a signal from an upstream side of the signal path are input, and a second circuit to which the second logical signal and an output from the first circuit are input.

6. The driver IC as defined in claim 4, wherein:
    first to fourth control signal lines are provided in each of the M rows to supply the first or second logical signal to the signal switch circuits;
    for the output pads in each of the M rows, odd-numbered signal switch circuits from one end among the signal switch circuits are connected in common to the first control signal line which supplies the first logical signal and the second control signal line which supplies the second logical signal; and
    for the output pads in each of the M rows, even-numbered signal switch circuits from one end among the signal switch circuits are connected in common to the third control signal line which supplies the first logical signal and the fourth control signal line which supplies the second logical signal.

7. The driver IC as defined in claim 1, wherein:
    part of the signal paths includes K branched signal lines (K is an integer greater than one) for each of the output pads;
    each of the signal switch circuits includes K circuit blocks respectively provided on the K branched signal lines; and
    the K circuit blocks allow signals from an upstream side of the K branched signal lines to pass through the K circuit blocks in the first state, and set a level pattern of signals passing through the K branched signal lines to the fixed pattern in the second state.

8. The driver IC as defined in claim 1, wherein:
first, second, and third logical signals are supplied to each of the signal switch circuits as the control signal;
one of two of the circuit blocks connected to two of the branched signal lines is controlled by the first and second logical signals, the other of the two circuit blocks being controlled by the first and third logical signals, and (K-2) remaining circuit blocks (K is an integer greater than two) being controlled by the control signal;
the K circuit blocks select one of the first and second states according to the first logical signal;
when the second state has been selected, the two circuit blocks select the fixed pattern according to the second and third logical signals, and an output potential from the (K-2) remaining circuit blocks is fixed to a constant value; and
when the first state has been selected, the two circuit blocks allow signals from an upstream side of the branched signal lines to pass through the two circuit blocks according to the second logical signal, and the (K-2) remaining circuit blocks allow signals from an upstream side of the branched signal lines to pass through the (K-2) remaining circuit blocks according to the first logical signal.

9. The driver IC as defined in claim 8, wherein:
first to sixth control signal lines are provided in each of the M rows to supply the first, second or third logical signal to the signal switch circuits;
for the output pads in each of the M rows, odd-numbered signal switch circuits from one end among the signal switch circuits are connected in common to the first control signal line which supplies the first logical signal, the second control signal line which supplies the second logical signal and the third control signal line which supplies the third logical signal; and
for the output pads in each of the M rows, even-numbered signal switch circuits from one end among the signal switch circuits are connected in common to the fourth control signal line which supplies the first logical signal, the fifth control signal line which supplies the second logical signal and the sixth control signal line which supplies the third logical signal.

10. A method of inspecting the driver IC as defined in claim 1, wherein pad-to-pad leakage is inspected by:
setting the driver IC to the first state;
supplying signals having the inspection level pattern through the signal paths to the output pads; and
causing the signals to be output from the output pads.

\* \* \* \* \*